(12) United States Patent
Bower et al.

(10) Patent No.: US 8,866,915 B2
(45) Date of Patent: Oct. 21, 2014

(54) HIGH SPEED, REAL-TIME, CAMERA BANDWIDTH CONVERTER

(75) Inventors: Dan E. Bower, Fremont, CA (US);
David A. Bloom, Lawndale, CA (US);
James R. Curry, Livermore, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 24 days.

(21) Appl. No.: 13/490,438

(22) Filed: Jun. 6, 2012

(65) Prior Publication Data
US 2012/0260300 A1    Oct. 11, 2012

Related U.S. Application Data

(63) Continuation-in-part of application No. 11/600,441, filed on Nov. 15, 2006, now abandoned.

(60) Provisional application No. 60/737,101, filed on Nov. 15, 2005.

(51) Int. Cl.
*H04N 5/225* (2006.01)
*H03M 7/30* (2006.01)

(52) U.S. Cl.
CPC .................................. *H03M 7/3064* (2013.01)
USPC .................. 348/207.1; 348/211.1; 348/425.3; 725/118

(58) Field of Classification Search
None
See application file for complete search history.

(56) References Cited

U.S. PATENT DOCUMENTS

| 6,160,578 | A | 12/2000 | Carroll et al. |
| 6,239,815 | B1* | 5/2001 | Frink et al. ................... 345/502 |
| 6,311,239 | B1* | 10/2001 | Matthews ........................ 710/66 |
| 6,714,193 | B1* | 3/2004 | Hasenzahl et al. ........... 345/418 |
| 6,778,187 | B1 | 8/2004 | Yi |
| 6,914,950 | B1 | 7/2005 | Luneau |
| 2001/0022554 | A1 | 9/2001 | Coene |
| 2002/0071026 | A1* | 6/2002 | Agraharam et al. ........ 348/14.08 |
| 2003/0081546 | A1* | 5/2003 | Agrawal et al. ............... 370/229 |
| 2004/0033784 | A1* | 2/2004 | Kojima et al. ................... 455/73 |
| 2004/0186933 | A1* | 9/2004 | Nanki et al. ..................... 710/33 |
| 2004/0196291 | A1* | 10/2004 | Porchet et al. ................ 345/543 |
| 2005/0232290 | A1* | 10/2005 | Mathew et al. ............... 370/412 |
| 2005/0249126 | A1* | 11/2005 | Chang et al. .................. 370/252 |
| 2007/0009060 | A1* | 1/2007 | Lavelle et al. ................ 375/295 |

FOREIGN PATENT DOCUMENTS

EP    1 107 224 A2    6/2001

OTHER PUBLICATIONS

Dierickx et al., "IBIS4 SXGA Image Sensor", Fill Factory, Jun. 2001.*
"Basler A500k Users's Manual", Basler Vision Technologies, Dec. 2004.

* cited by examiner

*Primary Examiner* — Dennis Hogue
(74) *Attorney, Agent, or Firm* — John P. Wooldridge (57) ABSTRACT

Image data from a CMOS sensor with 10 bit resolution is reformatted in real time to allow the data to stream through communications equipment that is designed to transport data with 8 bit resolution. The incoming image data has 10 bit resolution. The communication equipment can transport image data with 8 bit resolution. Image data with 10 bit resolution is transmitted in real-time, without a frame delay, through the communication equipment by reformatting the image data.

2 Claims, 5 Drawing Sheets

HIGH SPEED, REAL-TIME, CAMERA BANDWIDTH CONVERTER

This is a continuation-in-part of U.S. patent application Ser. No. 11/600,441 titled "High Speed Camera Bandwidth Converter" filed Nov. 15, 2006, incorporated herein by reference. U.S. patent application Ser. No. 11/600,441 claims priority to U.S. Provisional Patent Application Ser. No. 60/737,101, titled: "High Speed Camera Bandwidth Converter", filed Nov. 15, 2005, incorporated herein by reference.

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

1. Field of the Invention

The present invention relates to transmission of high speed camera data, and more specifically, it relates to techniques for real-time transmission of 10 bit data through equipment designed to transport data with 8 bit resolution. This invention applies to real-time streaming video transmission of camera data as well as high-speed, single image transport of image data.

2. Description of Related Art

Commercially available high speed streaming camera and data transmission equipment are frequently required in many fields of research. However, such equipment is unable to measure the intensity level of each image pixel with at least 10 bits (values of 0 to 1023) of measurement range. The commercially available equipment measures each pixel of the image with 8 bits (values of 0 to 255) of measurement range. It is desirable to measure the intensity level of each image pixel in real time with at least 10 bits of measurement range.

SUMMARY OF THE INVENTION

It is an object of the present invention to provide techniques for real-time transmission of 10 bit data from a high speed camera (both video and single image capture) through equipment designed to transport data with 8 bit resolution.

It is another object to measure the intensity level of each image pixel from a high speed camera image in real-time with at least 10 bits of measurement range.

These and other objects will be apparent based on the disclosure herein.

This invention takes image data, e.g., from a CMOS imaging sensor with 10 bit resolution and, in real time, reformats the data to allow it to pass through communications equipment designed to transport data with 8 bit resolution. In some embodiments, the incoming image data has 1280 columns and 1024 rows with 10 bit resolution. The communication equipment can transport image data that has 1280 columns and 1024 rows with 8 bit resolution. This invention transports image data that has 1000 columns and 1023 rows with 10 bit resolution through the communication equipment by reformatting the image data. This new transmission is accomplished in real time, without any image frame delay.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Real-time communications equipment are subject to an added "real-time constraint"—i.e., operational deadlines from event to system response. In contrast, a non-real-time system is one that cannot guarantee a response time in any situation, even if a fast response is the usual result. Real-Time video communications are a special class of real-time communications such that the operational deadlines (data processing in this case) must be accomplished before any new image data arrives.

Video data is often described as a "stream". This term encompasses the fact that much like the raster action of old tube style televisions, individual data elements consisting of pixels are constantly being transmitted and do not stop. Therefore, the processing that occurs on this data must be able to accomplish its tasks without holding up the system (or damming the stream). Generally, the individual pixels elements are grouped into packets of lines of data, and lines of video data are grouped into frames to make up a complete 2-dimensional image.

Between the packets of individual pixel element data packets, there is generally a rest period. This is a remnant of the raster tube televisions where the raster would need time to retrace back to the appropriate starting place of the raster gun writing data on the screen. There are 2 different types of rest periods in video systems: line rests and frame rests.

Line rests (generally about 10 microseconds) are much shorter than frame rests and occur to give the tube raster sufficient time to reset to the beginning line position while frame rests are generally about several milliseconds and occur to give the raster sufficient time to move back to the beginning of the frame position. If these rests did not occur, then one would see the bright lines written across the television screen as the tube raster would be emitting electrons as it retraced across the television screen.

Therefore, fundamentally, a real-time video system must be able to accomplish all data processing on every line packet of image pixel data before a new line packet of image pixel data arrives (usually 10's of microseconds but can vary based on image type). Further, the real-time video system must complete all processing on the frame of image data before the next frame of image data arrives. In an exemplary embodiment of the invention, a video data processing and transmission system must process and transmit in real-time (meaning that the data rate transmitted through an electronic communication system must equal the data rate entering the electronic communication system) a pixel stream (a stream of bytes) of 10 bit video data over a real-time data transmission system that is limited to 8 bits per pixel (byte). As the 10 bit stream is moving through the electronics system, 2 bits of data are stripped off of the 10 bit data and held for repackaging into another 8 bit byte. After 4 consecutive 10 bit pixels have been stripped to 8 bits and transmitted in real-time through the electronics communication system, then the 4 two bit bytes of data are combined and inserted into the data stream and transmitted as an 8 bit pixel (byte) without causing the transmission system sufficient delay to no longer be considered a real-time communications system. The process is continued until all streaming (image) data has been transmitted in real-time over the electronics communication system. The receiving end of the electronic communications system decodes the data in the exact reverse order of the encoding scheme in order to piece the 10 bit image back together.

Figure 1:
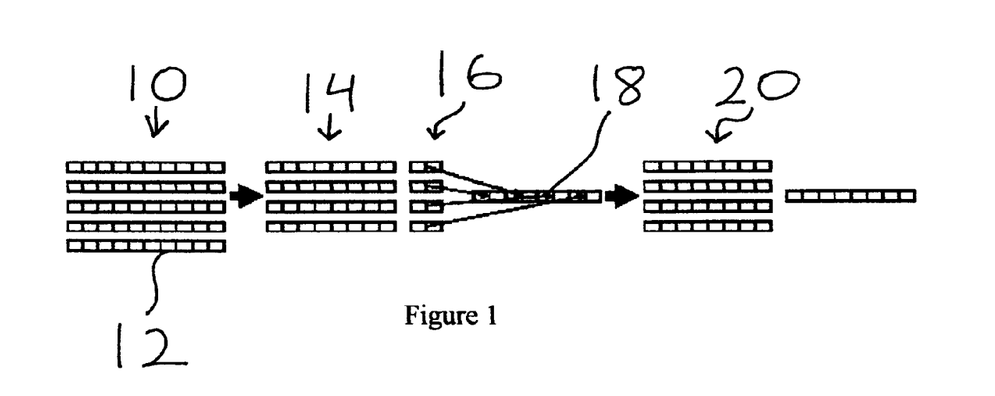
FIG. 1 illustrates a simple example of this basic concept where five packets of 10 bit data enter a system.

To send streaming camera image data having 10 bits of data for each pixel through a transmission system that is capable of sending 8 bits of data for each pixel, the incoming data from the camera must be modified in order to match the format of the transmission system and this modification must occur before any new data arrives. Rather than sending all of the image pixels, the present invention packs together (rebinds) the data in real time, and sends the additional 2 bits of data for each pixel. FIG. 1 illustrates a simple example of this basic concept where five packets of 10 bit data 10 enter a system. One packet 12 is deleted. From each of the remaining four packets of 10 bit data, 2 bits are removed, leaving four packets of 8 bit data 14 and four packets of 2 bit data 16. The 2 bits from each of the four packets of 2 bit data 16 are grouped into a new packet of 8 bit data 18, resulting in five packets of 8 bit data 20 comprising the data 14 and 16. Four of those packets contain 8 bit data and one of packet contains the additional two bits of data from each of the original four packets.

Figure 2:
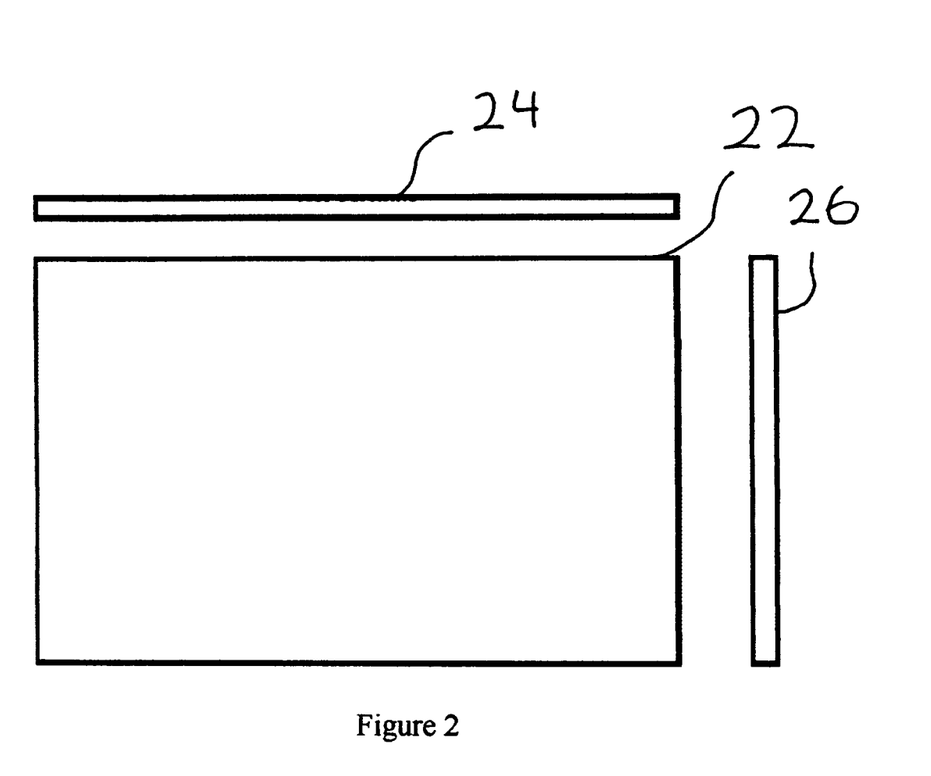
FIG. 2 illustrates image data that comes from the camera sensor.
Figure 3:
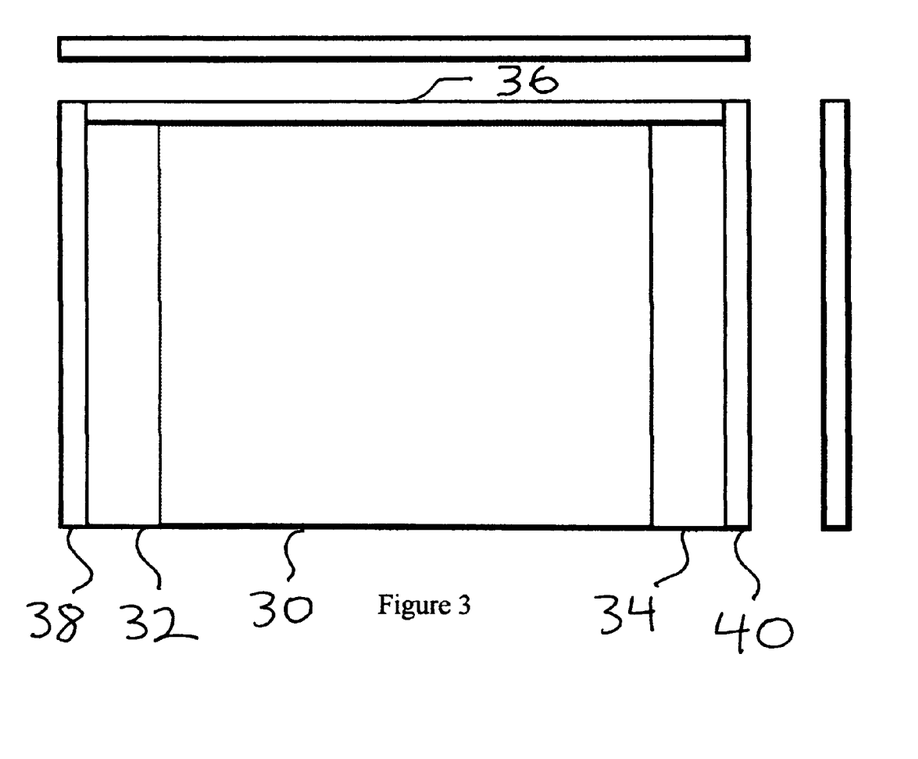
FIG. 3 shows an exemplary data transmission format.

FIG. 2 illustrates image data 22 that streams from the camera sensor. This data consists of 1280 columns 24 by 1024 rows 26 of pixels and each pixel has a 10 bit intensity value. The transmission system sends image data with 1280 columns by 1024 rows of pixels. However, it sends an 8 bit intensity value for each pixel. In order to send the extra two bits of intensity value, some of the pixel data are dropped and the extra two bits of intensity value are sent instead. FIG. 3 shows an exemplary data transmission format. The image 30 that is transmitted is reduced in size to 1000 columns by 1023 rows of pixels. The extra two bits are contained in 250 columns of pixels that are removed from the sensor data. Each of image portions 32 and 34 contain portions of the removed data. Additional information is added to the image data. User data is transmitted in real time in the first row 36. The row number is sent in the first 20 columns 38. A checksum is sent in the last 10 columns 40.

Figure 4:
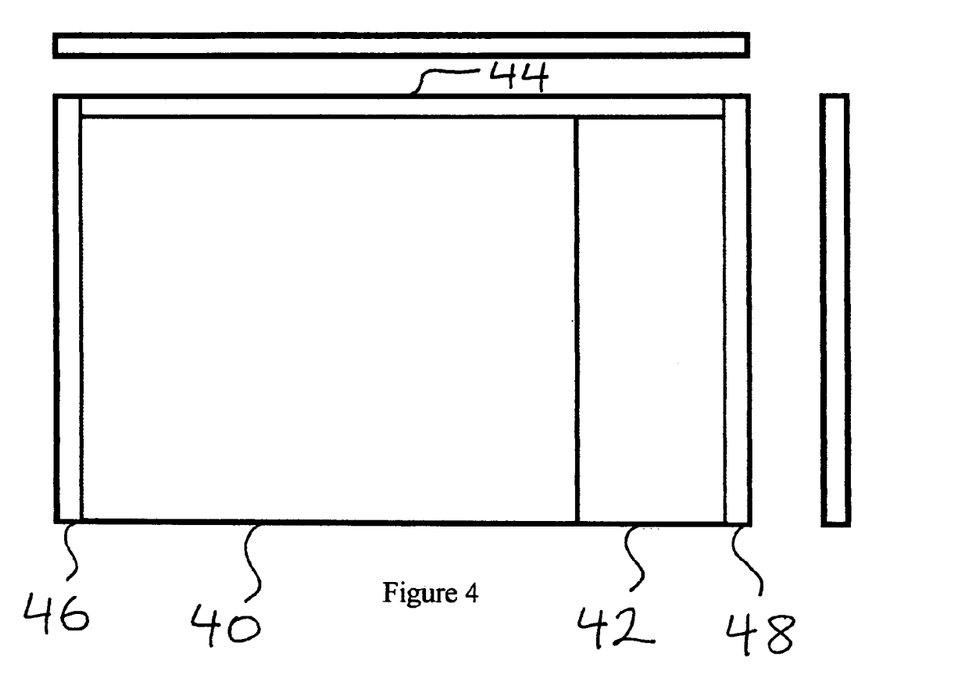
FIG. 4 shows a format where 1000 columns of 8 bit image data can be sent before sending the 250 columns of 2 bit data.

The transmission system image format can be arranged in alternate configurations. For example, FIG. 4 shows a format where the 1000 columns 40 of 8 bit image data can be sent before the 250 columns 42 of 2 bit data. This example also provides the additional information of user data sent in the first row 44, the row number sent in the first 20 columns 46 and a checksum sent in the last 10 columns 48.

After the camera sensor acquires an image, the image data is streamed from the sensor in a specific order. The sensor starts by sending out data for the first row. The sensor outputs pixel data for the pixels in 10 adjacent columns at the same time. Each pixel has a 10 bit value for the intensity. The image sensor data sequence is:

Row 1, Column 1, Column 2, Column 3, Column 4, Column 5, Column 6, Column 7, Column 8, Column 9, Column 10;

Row 1, Column 11, Column 12, Column 13, Column 14, Column 15, Column 16, Column 17, Column 18, Column 19, Column 20;

Row 1, Column 21, Column 22, Column 23, Column 24, Column 25, Column 26, Column 27, Column 28, Column 29, Column 30; (This pattern continues to the next occurrence of Row 1 as indicated below.)

Row 1, Column 1271, Column 1272, Column 1273, Column 1274, Column 1275, Column 1276, Column 1277, Column 1278, Column 1279, Column 1280;

Row 2, Column 1, Column 2, Column 3, Column 4, Column 5, Column 6, Column 7, Column 8, Column 9, Column 10;

Row 2, Column 11, Column 12, Column 13, Column 14, Column 15, Column 16, Column 17, Column 18, Column 19, Column 20;

Row 2, Column 21, Column 22, Column 23, Column 24, Column 25, Column 26, Column 27, Column 28, Column 29, Column 30; (This pattern continues through the next occurrence of Row 2 as indicated below.)

Row 2, Column 1271, Column 1272, Column 1273, Column 1274, Column 1275, Column 1276, Column 1277, Column 1278, Column 1279, Column 1280; (This pattern continues until the next occurrence of Row 1024 as indicated below.)

Row 1024, Column 1, Column 2, Column 3, Column 4, Column 5, Column 6, Column 7, Column 8, Column 9, Column 10;

Row 1024, Column 11, Column 12, Column 13, Column 14, Column 15, Column 16, Column 17, Column 18, Column 19, Column 20;

Row 1024, Column 21, Column 22, Column 23, Column 24, Column 25, Column 26, Column 27, Column 28, Column 29, Column 30; and this pattern continues through to Row 1024, Column 1271, Column 1272, Column 1273, Column 1274, Column 1275, Column 1276, Column 1277, Column 1278, Column 1279, Column 1280.

Figure 5:
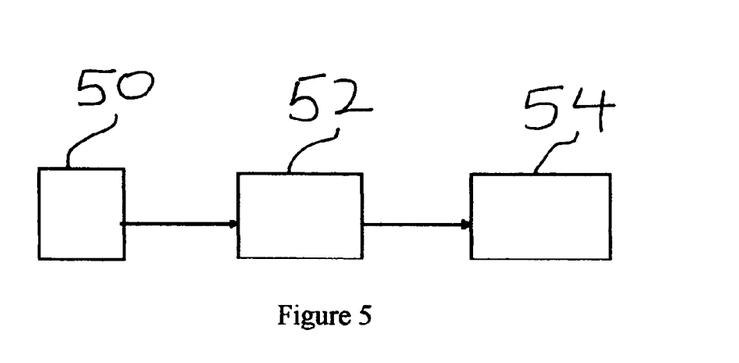
FIG. 5 shows a high level system block diagram.

FIG. 5 shows a high level system block diagram. Image sensor 50 provides 10 bit streaming data to image data conversion logic 52 which alters the data format into the 8 bit data that is sent to the image data transmission equipment 54. The image data conversion logic 52 is a configured on a field programmable gate array (FPGA) and stores the input data in memories on a line by line basis. The final conversion occurs in real-time without a frame delay. Given the explanation of the data conversion logic herein, one skilled in the art can program one or more commercially available FPGAs to perform the functions of the present invention.

A FPGA is a semiconductor device containing programmable logic components and programmable interconnects. The programmable logic components can be programmed to duplicate the functionality of basic logic gates such as AND, OR, XOR, NOT or more complex combinational functions such as decoders or simple math functions. In most FPGAs, these programmable logic components (or logic blocks, in FPGA parlance) also include memory elements, which may be simple flip-flops or more complete blocks of memories. A hierarchy of programmable interconnects allows the logic blocks of an FPGA to be interconnected as needed by the system designer, somewhat like a one-chip programmable breadboard. These logic blocks and interconnects can be programmed after the manufacturing process by the customer/designer (hence the term "field programmable") so that the FPGA can perform whatever logical function is needed.

To define the behavior of the FPGA, the user provides a hardware description language (HDL) or a schematic design. Common HDLs are VHDL and Verilog. Then, using an electronic design automation tool, a technology-mapped netlist is generated. The netlist can then be fitted to the actual FPGA architecture using a process called place-and-route, usually performed by the FPGA company's proprietary place-androute software. The user will validate the map, place, and route results via timing analysis, simulation, and other verification methodologies. Once the design and validation process is complete, the binary file generated (also using the FPGA company's proprietary software) is used to (re)configure the FPGA.

Figure 6:
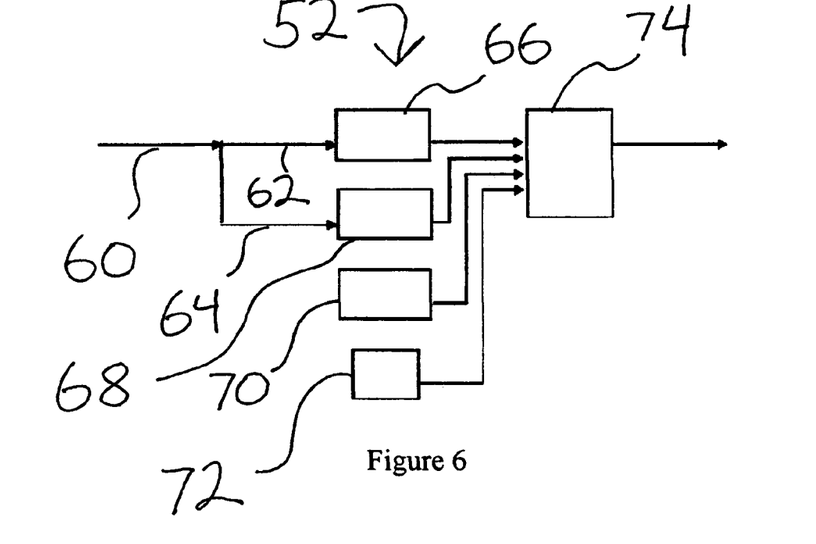
FIG. 6 shows a flow diagram of image data conversion logic.

Referring to FIG. 6, which shows a flow diagram of image data conversion logic 52, the 10 bit input data 60 from the image sensor (not shown) is split into two sets of data comprising the 8 bit data 62 and the two bit data 64. The 8 bit data is stored in the 8 bit memory 66 and the two bit data is concatenated with three other sets of two bit data and stored in the 2 bit memory 68. The row number (70) and user data (72), along with the 8 bit data 66 and the 2 bit data 68, are routed to a data selector 74 discussed below.

Figure 7:
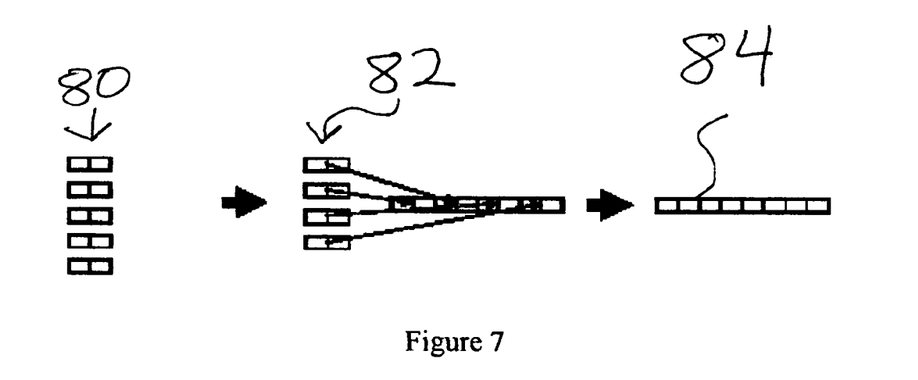
FIG. 7 illustrates a procedure where four 2 bit sets are concatenated to produce 8 bit data.

The following example shows how two bit data is combined. Row 1, Column 1 (2 bits)+Row 1, Column 11 (2 bits)+Row 1, Column 21 (2 bits)+Row 1, Column 31 (2 bits)=8 concatenated bits. FIG. 7 illustrates a procedure where four 2 bit sets 80 are concatenated 82 to produce 8 bit data 84. The fifth packet of 2 bit data is deleted as part of the deleted packet of 10 bit data deleted in FIG. 1.

Image data conversion logic data selector 74 generates the desired output. One complete row of image data is stored in the 8 bit and 2 bit memories before the output of data begins. The Data Selector 74 outputs data according to the desired format. The Data Selector outputs pixel data for the pixels in 10 adjacent columns at the same time.

The output data sequence corresponding to the image format in FIG. 4 is:
- Row Upper, Row Upper, Row Upper, Row Upper, Row Upper, Row Upper, Row Upper, Row Upper, Row Upper, Row Upper;
- Row Lower, Row Lower, Row Lower, Row Lower, Row Lower, Row Lower, Row Lower, Row Lower, Row Lower, Row Lower;
- User 1, User 2, User 3, User 4, User 5, User 6, User 7, User 8, User 9, User 10;
- User 11, User 12, User 13, User 14, User 15, User 16, User 17, User 18, User 19, User 20;
- User 21, User 22, User 23, User 24, User 25, User 26, User 27, User 28, User 29, User 30; (This pattern continues to User 1241 as indicated below.)
- User 1241, User 1242, User 1243, User 1244, User 1245, User 1246, User 1247, User 1248, User 1249, User 1250;
- Check, Check, Check, Check, Check, Check, Check, Check, Check, Check;
- Row Upper, Row Upper, Row Upper, Row Upper, Row Upper, Row Upper, Row Upper, Row Upper, Row Upper, Row Upper;
- Row Lower, Row Lower, Row Lower, Row Lower, Row Lower, Row Lower, Row Lower, Row Lower, Row Lower, Row Lower;
- Row 1, Column 1, Column 2, Column 3, Column 4, Column 5, Column 6, Column 7, Column 8, Column 9, Column 10;
- Row 1, Column 11, Column 12, Column 13, Column 14, Column 15, Column 16, Column 17, Column 18, Column 19, Column 20;
- Row 1, Column 21, Column 22, Column 23, Column 24, Column 25, Column 26, Column 27, Column 28, Column 29, Column 30; (This pattern continues to the next occurrence of Row 1 as indicated below.)
- Row 1, Column 991, Column 992, Column 993, Column 994, Column 995, Column 996, Column 997, Column 998, Column 999, Column 1000;
- Row1, TwoBit1-4, TwoBit5-8, TwoBit9-12, TwoBit13-16, TwoBitl7-20, TwoBit21-24, TwoBit25-28, TwoBit29-32, TwoBit33-36, TwoBit37-40;
- Row1, TwoBit41-44, TwoBit45-48, TwoBit49-52, TwoBit53-56, TwoBit57-60, TwoBit61-64, TwoBit65-68, TwoBit69-72, TwoBit73-76, TwoBit77-80;
- Row1, TwoBit961-964, TwoBit965-968, TwoBit969-972, TwoBit973-976, TwoBit977-980, TwoBit981-984, TwoBit985-988, TwoBit989-992, TwoBit993-996, TwoBit997-1000;
- Check, Check, Check, Check, Check, Check, Check, Check, Check, Check;
- Row Upper, Row Upper, Row Upper, Row Upper, Row Upper, Row Upper, Row Upper, Row Upper, Row Upper, Row Upper;
- Row Lower, Row Lower, Row Lower, Row Lower, Row Lower, Row Lower, Row Lower, Row Lower, Row Lower, Row Lower;
- Row 2, Column 1, Column 2, Column 3, Column 4, Column 5, Column 6, Column 7, Column 8, Column 9, Column 10;
- Row 2, Column 11, Column 12, Column 13, Column 14, Column 15, Column 16, Column 17, Column 18, Column 19, Column 20;
- Row 2, Column 21, Column 22, Column 23, Column 24, Column 25, Column 26, Column 27, Column 28, Column 29, Column 30; (This pattern continues to the next occurrence of Row 2 as indicated below.)
- Row 2, Column 991, Column 992, Column 993, Column 994, Column 995, Column 996, Column 997, Column 998, Column 999, Column 1000;
- Row2, TwoBit1-4, TwoBit5-8, TwoBit9-12, TwoBit13-16, TwoBitl7-20, TwoBit21-24, TwoBit25-28, TwoBit29-32, TwoBit33-36, TwoBit37-40;
- Row2, TwoBit41-44, TwoBit45-48, TwoBit49-52, TwoBit53-56, TwoBit57-60, TwoBit61-64, TwoBit65-68, TwoBit69-72, TwoBit73-76, TwoBit77-80; (This pattern continues to the next occurrence of Row2 as indicated below.)
- Row2, TwoBit961-964, TwoBit965-968, TwoBit969-972, TwoBit973-976, TwoBit977-980, TwoBit981-984, TwoBit985-988, TwoBit989-992, TwoBit993-996, TwoBit997-1000;
- Check, Check, Check, Check, Check, Check, Check, Check, Check, Check; (This pattern continues to the next occurrence of Row Upper as indicated below.)
- Row Upper, Row Upper, Row Upper, Row Upper, Row Upper, Row Upper, Row Upper, Row Upper, Row Upper, Row Upper;
- Row Lower, Row Lower, Row Lower, Row Lower, Row Lower, Row Lower, Row Lower, Row Lower, Row Lower, Row Lower;
- Row 1023, Column 1, Column 2, Column 3, Column 4, Column 5, Column 6, Column 7, Column 8, Column 9, Column 10;
- Row 1023, Column 11, Column 12, Column 13, Column 14, Column 15, Column 16, Column 17, Column 18, Column 19, Column 20;
- Row 1023, Column 21, Column 22, Column 23, Column 24, Column 25, Column 26, Column 27, Column 28, Column 29, Column 30; (This pattern continues until the next occurrence of Row 1023 as indicated below.)
- Row 1023, Column 991, Column 992, Column 993, Column 994, Column 995, Column 996, Column 997, Column 998, Column 999, Column 1000;

Row1023, TwoBit1-4, TwoBit5-8, TwoBit9-12, TwoBit13-16, TwoBitl7-20, TwoBit21-24, TwoBit25-28, TwoBit29-32, TwoBit33-36, TwoBit37-40;

Row1023, TwoBit41-44, TwoBit45-48, TwoBit49-52, TwoBit53-56, TwoBit57-60, TwoBit61-64, TwoBit65-68, TwoBit69-72, TwoBit73-76, TwoBit77-80; (This pattern continues until the next occurrence of Row 1023 as indicated below.)

Row1023, TwoBit961-964, TwoBit965-968, TwoBit969-972, TwoBit973-976, TwoBit977-980, TwoBit981-984, TwoBit985-988, TwoBit989-992, TwoBit993-996, TwoBit997-1000; and Check, Check, Check, Check, Check, Check, Check, Check, Check, Check.

The converted data is streamed through the transmission equipment. At the other end of the transmission link the data is received. When the received image data is viewed without post processing, the viewer sees a 1000 by 1023 pixel image with 8 bit pixel intensity values. The two bit data areas, row number, and user data portions of the image looks like noise. If post processing is applied, the viewer sees a 1000 by 1023 image with 10 bit pixel intensity values. The 10 bit pixel intensity values give the image a broader range of intensity values. The 10 bit pixel value is reconstructed by locating the correct 2 bit value in the data and concatenating it to the 8 bit data. The reconstructed value is then stored in the correct pixel location in the image.

The Ten Bit Image Decoder Software (TBIDS), written in MATLAB, is a method for accomplishing the task of reconstructing the encoded 8 bit image into a 10 bit image on a non-real time basis. The premise behind the software is that a certain amount of encoding data replaces the first line of the streaming image allowing for automated decoding of the image.

Most CameraLink frame-grabbers will grab the streaming image and write it to a file. In most cases this file will be a 16 bit TIFF file; however, TBIDS is very flexible with file type due to the power of MATLAB. Further, TBIDS requires a MATLAB runtime on the decoding PC computer. At the filing date of this patent application, this runtime installation is available for free from Mathworks.com, which is the MATLAB developer.

The TBIDS algorithm operates as follows:
1. Open the Image File (TIFF or otherwise);
2. Read first line of the image to determine the encoding scheme;
   a. Note that the encoding data is read from line 1 of the image data as opposed to a header in the opened file. This technique allows for complete autonomy from the file structure of the PC computer that writes the file.
   b. The parameters in line 1, starting at pixel 101, are as follows:
      i. Row number.
      ii. LeftSideLSBArray—this is the parameter that states the total number of packed pixels in a packed array that will occur before each line of the active image is read. The purpose for having a Left and Right side LSB array is because when streaming data from a camera, where the actual active image is taken from the sensor is user defined and unless the camera has a frame buffer, this choice is somewhat limited.
      iii. LeftSideAIA—this is the parameter that states the 8 bit active image area that is associated with all packed data in the LeftSideLSBArray.
      iv. RightSideAIA—this is the parameter that states the 8 bit active image area that is associated with all packed data in the RightSideLSBArray.
      v. RightSideLSBArray—this is the parameter that states the total number of pixels that will occur after the image is read out.
      vi. Total active image area—this should be the sum of LeftSideAIA and RightSideAIA.
      vii. Sum Check for line 1;
3. Using the parameters from Line 1, TBIDS parses the file into 3 separate arrays:
   a. 8 bit active image array;
   b. 2 bit LSB array;
   c. Pass through data array (e.g., line 1 of the file);
4. TBIDS then appends the 8 bit image array with the 2 bit image array to reconstruct the complete 10 bit image.
5. Finally, TBIDS inserts the pass through data to the 10 bit image array and saves the file as a 16 bit TIFF file.

The result of the automated TBIDS procedure is a 16 bit TIFF file that contains a complete 10 bit image and the pass through data. This file can be opened with most commercial image editing and processing programs.

A general embodiment of the invention includes a method and an apparatus that implements the method, where the method comprises one or more of the steps: (i) providing at least one first packet of image data comprising X number of binary bits from a primary location of an image data array, (ii) providing data transmission equipment capable of transmitting no more than Y number of binary bits, wherein $Y<X$, (iii) separating Z number of bits from said at least one first packet of data, wherein $X>Z \geq X-Y$, to produce a second packet of data comprising Z bits and a third packet of data comprising $\leq Y$ bits, (iv) storring said second packet of data in a secondary location of said image data array to produce a stored second packet of data (v) transmitting said stored second packet and said third packet across said data transmission equipment to produce a transmitted second packet and a transmitted third packet; and (vi) reconstructing said at least one first packet of data from said transmitted second packet and said transmitted third packet. The primary location is the original position of the image data in the image data array. In one embodiment, prior to storring the second packet of data, a number of bits $W \geq Z$ are removed from the secondary location to make enough room for the Z bits. In another embodiment, prior to storring the second packet of data, said method further comprises removing all bits located in the secondary location.

A digital computer system can be programmed to perform the method of this invention. Once programmed to perform particular functions pursuant to instructions from program software that implements the method of this invention, such digital computer system in effect becomes a special-purpose computer particular to the method of this invention. The techniques necessary for this are well-known to those skilled in the art of computer systems.

Computer programs implementing the method of this invention will commonly be distributed to users on a distribution medium such as floppy disk or CD-ROM. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The term "computer-readable medium" encompasses distribution media, intermediate storage media, execution memory of a computer, and any other medium or device capable of storing for later reading by a computer a computer program implementing the method of this invention.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method of streaming 10 bit pixel data through transmission equipment designed for transmitting 8 bit data, comprising:

providing a first data frame having a plurality of 10 bit packets of pixel data arranged in a plurality of rows and a plurality of columns;

deleting a portion of said plurality of 10 bit packets to produce a plurality of remaining 10 bit packets;

removing 2 bits from each of said remaining 10 bit packets to produce first 8 bit packets and 2 bit packets;

grouping sets of four packets of said 2 bit packets into second 8 bit packets;

grouping said first 8 bit packets into a contiguous first region of 8 bit image data;

grouping said second 8 bit packets into a contiguous second region of 8 bit image data;

providing additional information, user data, and checksum data;

combining the contiguous first region of 8 bit image data, the contiguous second region of 8 bit image data, the additional information, the user data, and the checksum data to produce a second data frame having the same number of rows and columns as the first data frame;

transmitting said second data frame through said transmission equipment; and reconstructing said plurality of remaining 10 bit packets from said contiguous first region of 8 bit image data and said contiguous second region of 8 bit image data of said transmitted second data frame.

2. The method of claim 1, wherein said transmission equipment comprises an 8 bit data transmission limit.

\* \* \* \* \*